United States Patent [19]

Lechner

[11] Patent Number: 4,629,913

[45] Date of Patent: Dec. 16, 1986

[54] CIRCUIT ARRANGEMENT FOR CONVERTING ECL-LOGIC SIGNALS TO TTL-LOGIC SIGNALS

[75] Inventor: Alexander Lechner, Faak, Austria

[73] Assignee: Siemens Aktiengesellschaft, Berlin and Munich, Fed. Rep. of Germany

[21] Appl. No.: 491,863

[22] Filed: May 5, 1983

[30] Foreign Application Priority Data

May 10, 1982 [DE] Fed. Rep. of Germany ....... 3217512

[51] Int. Cl.[4] ................ H03K 19/092; H03K 19/086; H03K 19/013; H03K 17/04
[52] U.S. Cl. .................................... 307/475; 307/455; 307/247 R; 307/264; 323/316
[58] Field of Search ................................ 307/454–458, 307/466, 467, 475, 482, 544, 546, 547, 549, 551, 553, 558, 559, 560, 567, 264, 443, 270, 247 R; 323/315, 316

[56] References Cited

U.S. PATENT DOCUMENTS

| | | | |
|---|---|---|---|
| 3,491,251 | 1/1970 | Witsell | 307/457 X |
| 3,676,707 | 7/1972 | Conrad et al. | 307/264 X |
| 3,766,406 | 10/1973 | Bryant et al. | 307/475 |
| 4,356,409 | 10/1982 | Masuda et al. | 307/264 |
| 4,456,838 | 6/1984 | Taguchi et al. | 307/264 |
| 4,533,838 | 8/1985 | Fujita | 307/247 R X |
| 4,539,493 | 9/1985 | Varadarajan | 307/455 |

FOREIGN PATENT DOCUMENTS 0009083 12/1979 European Pat. Off. ............ 307/475

OTHER PUBLICATIONS

Integrated Circuits Catalog for Design Engineers, 1st Edition, Texas Instruments, 1971, pp. 4–73 to 4–84.
Motorola MECL Integrated Circuits, 1978, p. 3-19 prepared by Technical Information Center.
U. Tietz and Ch. Schenk, Halbleiter-Schaltungstechnik (Semiconductor Circuit Technology), 5th Edition, Springer-Verlag, Berlin-Heidelberg-New York, 1980, pp. 153–154.

*Primary Examiner*—Stanley D. Miller
*Assistant Examiner*—David R. Bertelson
*Attorney, Agent, or Firm*—Herbert L. Lerner; Laurence A. Greenberg

[57] ABSTRACT

A circuit arrangement for level conversion of ECL-logic levels to TTL-logic levels, having an emitter-coupled current switch with an input addressable by ECL-logic levels, and a TTL-logic output stage, includes a voltage-controlled current source having an input addressable by an output of the current switch, and having an output connected to the TTL-logic output stage.

9 Claims, 5 Drawing Figures

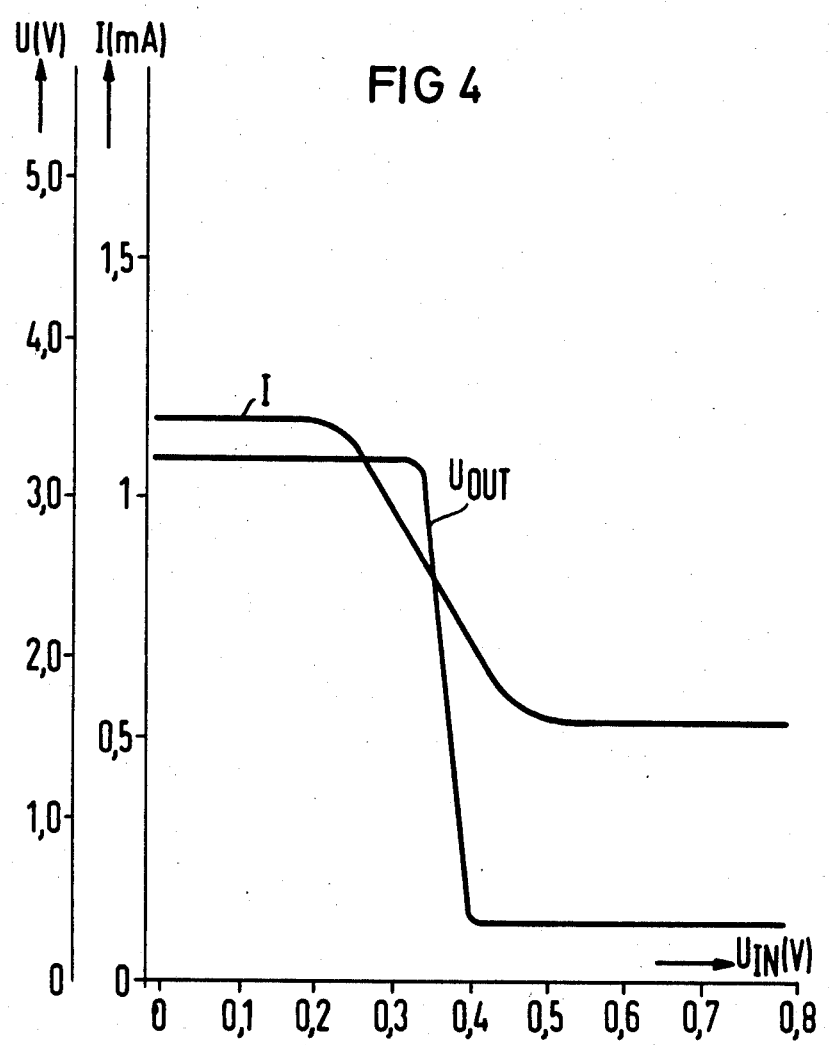

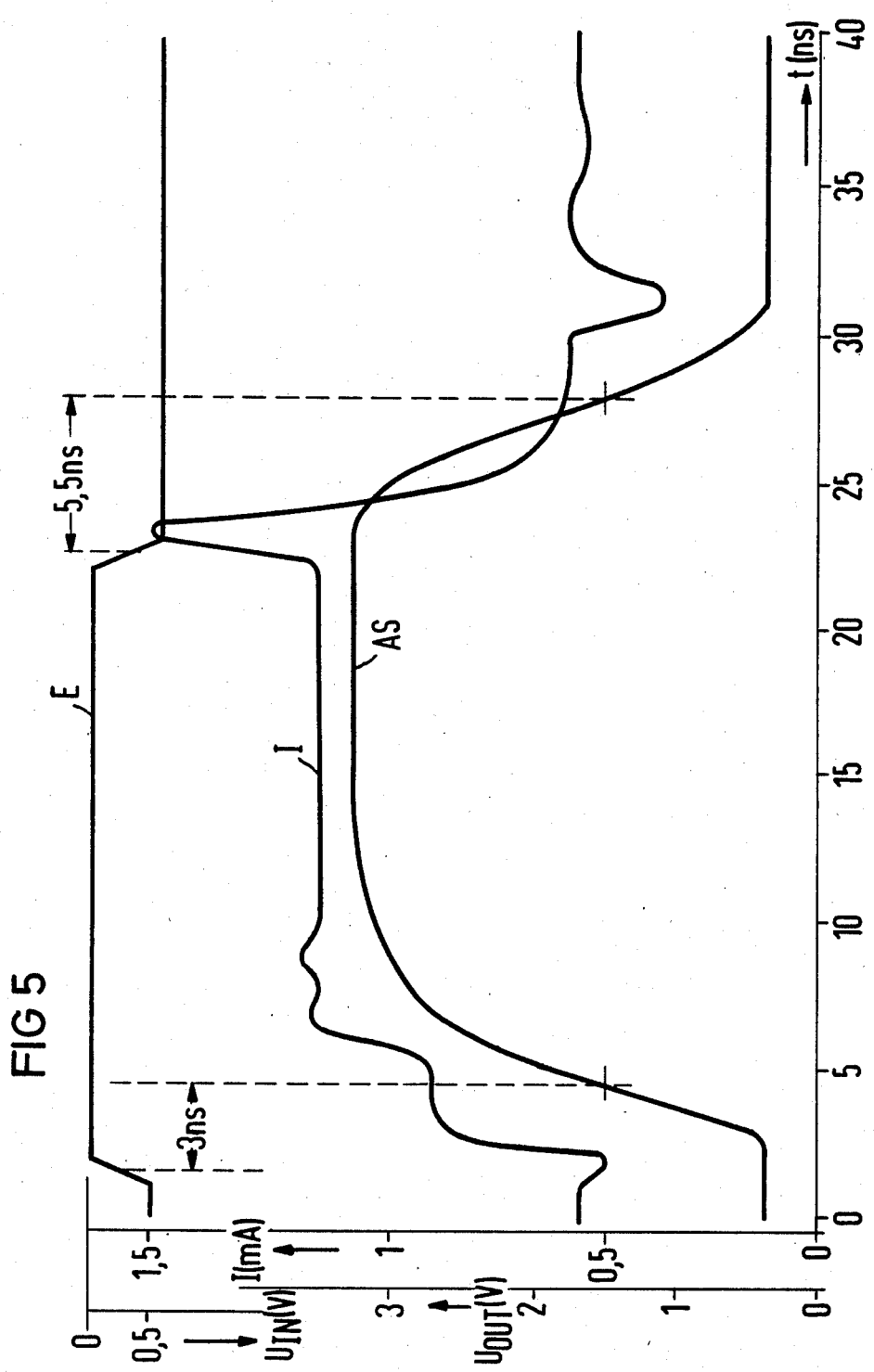

CIRCUIT ARRANGEMENT FOR CONVERTING ECL-LOGIC SIGNALS TO TTL-LOGIC SIGNALS

The invention relates to a circuit arrangement for level conversion from ECL-logic levels to TTL-logic levels, having an emitter-coupled current switch addressed on the input side by ECL-logic levels, and a TTL-output stage.

By means of level converters, the logic levels of one family of switching elements are converted to the logic levels of another family. By ECL levels there is understood to mean the levels of ECL (emitter-coupled logic) technology; by TTL levels, the levels of TTL (transistor-transistor logic) technology but in general also other standard logic levels such as the levels of RTL (resistance-transistor logic), DTL (diode-transistor logic) technology or HLL (high level logic) levels, for example. TTL levels, as a rule, are standardized so that the voltage, referred to the potential "0" must be $\geq 2$ volts for representing a logical "high" state and $\leq 0.8$ volts for representing a logical "low" state. The ECL levels are, in general, also referred to the potential "0", but have a distinctly smaller interference margin between "high" state and "low" state. For example, with ECL levels, the voltage for representing a logical "high" state must be $\geq -0.98$ volts and for representing a logical "low" state $\leq -1.63$ volts.

Circuit arrangements of the type mentioned at the introduction hereto are known, for example, from the Integrated Circuits Catalog for Design Engineers, First Edition, Texas Instruments, 1971, pages 4–73 to 4–84 or from Motorola MECL Integrated Circuits, 1978, pages 3–21. In order that ECL as well as TTL levels may be referred to the voltage "0", the heretofore known circuit arrangements require two supply voltages of different polarity and, therefore, a more expensive power supply than level converters according to the invention which require only one supply voltage.

It is accordingly an object of the invention to provide a circuit arrangement for level conversion which has brief delay times and requires only a single supply voltage.

With the foregoing and other objects in view, there is provided, in accordance with the invention, a circuit arrangement for level conversion of ECL-logic levels to TTL-logic levels having an emitter-coupled current switch with an input addressable by ECL-logic levels, and a TTL-logic output stage, comprising a voltage-controlled current source having an input addressable by an output of the current switch, and having an output connected to the TTL-logic output stage.

In accordance with another feature of the invention, the current source comprises a current mirror and a transistor diode.

In accrodance with a further feature of the invention, the output of the current switch is a non-inverting output.

In accordance with an added feature of the invention, the current switch also has an inverting output, and there is provided a capacity connected intermediate the inverting output of the current switch and an input of the TTL-logic output stage.

In accordance with an additional feature of the invention, the TTL-logic output stage is a push-pull stage.

In accordance with again another feature of the invention, the TTL-logic output stage has at least one transistor, and there are provided means for clamping the residual collector-emitter voltage of the transistor.

In accordance with again a further feature of the invention, the TTL-logic output stage has at least one transistor, and there are provided means for clamping base potentials of the transistors.

In accordance with a concomitant feature of the invention, the current mirror has a working transistor, and there are provided means for clamping the residual collector-emitter voltage of the working transistor.

Other features which are considered as characteristic for the invention are set forth in the appended claims.

Although the invention is illustrated and described herein as embodied in a circuit arrangement for level conversion, it is nevertheless not intended to be limited to the details shown, since various modifications and structural changes may be made therein without departing from the spirit of the invention and within the scope and range of equivalents of the claims.

The construction and method of operation of the invention, however, together with the addtional objects and advantages thereof will be best understood from the following description of specific embodiments when read in connection with the accompanying drawings, in which:

FIG. 4 is a plot diagram of a static transfer characteristic of a circuit arrangement according to the invention; and FIG. 5 is a pulse diagram illustrating the switching behavior of an embodiment of the circuit arrangement according to the invention.

In the figures, like elements are identified by the same reference characters.

Figure 1:
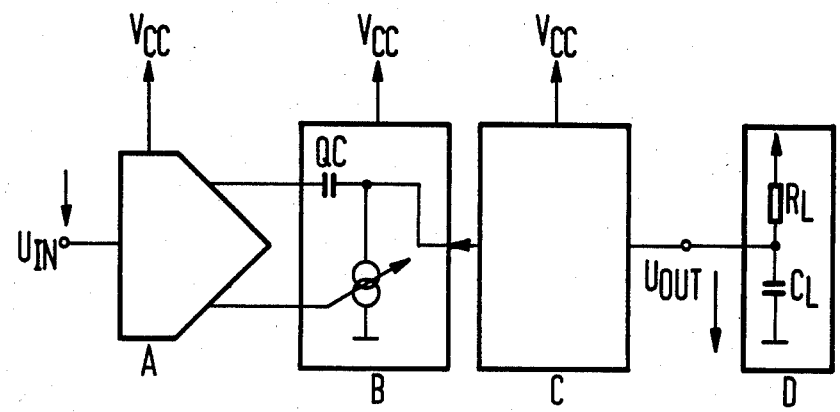
FIG. 1 is a block diagram for a circuit arrangement according to the invention.

Referring now to the drawing and first, particularly, to FIG. 1 thereof, there is shown a basic or block diagram of a level converter according to the invention wherein an input voltage $U_{IN}$ corresponding to an ECL level drives an ECL output differential amplifier A which has an output voltage excursion of $\Delta U$. The input level $U_{IN}$ is referred to the supply voltage $V_{cc}$. The differential amplifier A drives a special matching network in the form of a voltage-controlled current source B which generates different currents depending upon the input potential applied to the input thereof, and in turn drives a TTL output stage C which converts the different currents into the desired TTL levels. The output voltage $U_{Out}$ of the TTL output stage C can then drive a load circuit D having a load resistor $R_L$ and a load capacity $C_L$.

The blocks A, B and C are supplied with a supply voltage $V_{cc}$ which is identical for all three blocks.

It is possible thereby to solve the main problem for realizing an ECL-TTL level converter, namely the different reference potentials for both levels (positive supply for ECL, negative supply for TTL) by means of a special matching network in the form of a voltage-controlled current source.

The switching behavior is further improved by an additional dynamic voltage coupling by means of a capacitor QC inserted between the output of the differential amplifier A and the current source B.

Figure 2:
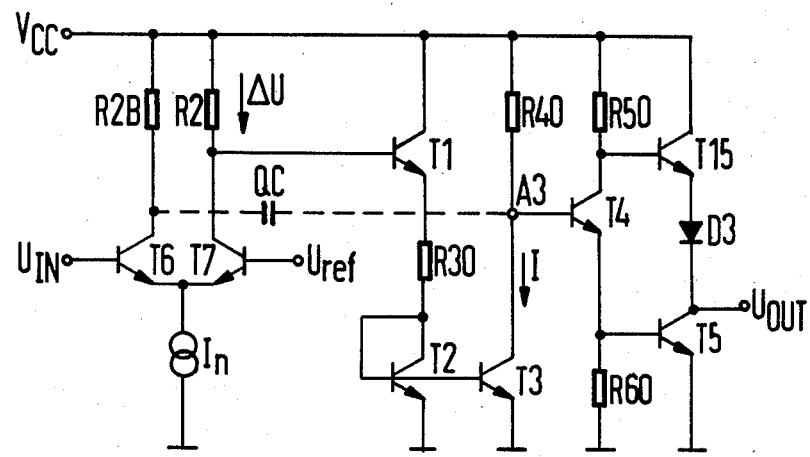
FIG. 2 is a circuit diagram of one embodiment of a circuit arrangement according to FIG. 1.

FIG. 2 shows a circuit diagram of an embodiment which is a highly simplified realization of the converter according to the invention. Block A of FIG. 1 is realized as an ECL output differential amplifier constructed as a conventional current switch i.e. of two emitter-coupled npn transistors T6 and T7, the collectors of which are connected via collector resistors R2B and R2 to the supply coltage $V_{cc}$, and the emitters of which are connected to a current source $I_n$ which, in turn, is tied to ground. The base of the transistor T6 is addressed by the input signal $U_{IN}$, and the base of the transistor T7 is connected to the reference voltage $U_{ref}$, which is chosen so that it is approximately in the middle between the "high" and the "low" level of the input signal $U_{IN}$.

Suitable differential amplifiers are known, for example, from U. Tietze and Ch. Schenk, Halbleiter-Schaltungstechnik (Semiconductor Circuit Technology), 5th Edition, Springer-Verlag Berlin - Heidelberg-New York, 1980, especially pages 153 and 154.

At the non-inverting output of the current switch formed by the transistors T6 and T7 and at the resistor R2, respectively, the voltage is equal to $V_{cc}$ if the input signal $U_{IN}$ is "high" and is equal to $V_{cc}-\Delta U$ if the output signal $U_{IN}$ is "low". $\Delta U$ is identified as the output voltage excursion. The resistor R2 is designed so that the output voltage excursion $\Delta U$ has the desired magnitude which, in general, is greater than that of the voltage excursion of a conventional ECL current switch.

The current source B is formed of the transistors T1, T2 and T3 and therefore is realized, in the illustrated embodiment of FIG. 2, as a current mirror with a transistor diode. The transistor T1 which is connected by its base to the non-inverting output of the differential amplifier A, acts as an emitter-follower and thereby controls the current through its emitter resistor R30. The transistors T2 and T3 are connected as current mirrors with a transistor diode i.e. their base as well as their emitter electrodes are coupled to one another; the base and the collector of the transistor T2 acting as the transistor diode are short-circuited, and the baseemitter threshold voltage of the transistors T2 and T3 is identical.

Suitable circuits are known, for example, from U. Tietze and Ch. Schenk, Halbleiter-Schaltungstechnik (Semiconductor Circuit Technology), 5th Edition, Springer-Verlag Berlin - Heidelberg - New York, 1980, pages 55 and 56, which result in the collector currents I of both transistors being identical, and the current therefore being "mirrored".

The current source B is of such construction that, when a high voltage is present at the input (base of the transistor T1), a large control current I flowing to ground is available, and when the voltage at the input is small, a small control current I, which, however, differs from zero, is available at the output A3 and flows to ground. Advantageously, the large control current I should be chosen at least twice and, in particular, two to four times as large as the small control current.

The control current I controls the TTL-output stage C which may be constructed as a conventional TTL-output stage. In the embodiment of FIG. 2, the output stage is formed as a push-pull stage, having a transistor T4, the base of the transistor T4 being connected to the output A3 and, via the resistor R40, to the supply voltage $V_{cc}$, the collector of the transistor T4 having a collector resistor R50 connected thereto, and the emitter of the transistor T4 having an emitter resistor R60 connected thereto, the transistor T 4 thus serving as the driver transistor for the transistors T5 and T15. The output voltage $U_{Out}$ corresponding to the TTL levels can be taken off the output of the transistor T5, the base of which is connected to the emitter of the transistor T4 and the emitter of which is connected to ground. The transistor T 15, the base of which is connected to the collector of the transistor T4, and the collector of which is connected to the supply voltage $V_{cc}$, and the diode D3 which is inserted between the emitter of the transistor T15 and the collector of the transistor T5, act as a so-called "pullup" i.e. for pulling up the output voltage $U_{Out}$ in direction of the supply voltage $V_{cc}$.

If the voltage present at the base of the transistor T4 is larger than two emitter-base threshold voltages, the transistors T4 and T5 then conduct and the output voltage $U_{Out}$ is therefore small ("low" level). If the base voltage of the transistor T4 is smaller than two base-transmitter threshold voltages, the transistor T5 is cut off and a "high" level is present at the output $U_{Out}$.

The resistor R40 should advantageously be designed so that, for minimum control current $I_{Hmin}$ for a "high" output signal (taking into consideration all stray effects), the following equation is fulfilled:

$$V_{cc,\ max}-R_{40}\cdot I_{Hmin}<2\cdot U_{be}$$

wherein $V_{cc,\ max}$=maximum supply voltage, and
$U_{be}$=base-emitter threshold voltage.
With a maximum control current $I_{Lmax}$ for a "low" output signal (taking into consideration all stray effects), the following equation is fulfilled:

$$V_{cc,\ min}-R_{40}\cdot I_{Lmax}>2U_{be}$$

wherein $V_{cc,\ min}$=minimum supply voltage.

In this manner it is possible to provide an ECL-TTL level converter, which is designed internally in ECL-circuit technology especially for an integrated circuit, has external TTL compatible terminals and is exclusively operated with one supply voltage (for example +5 volts By using current coupling (current source B) instead of voltage coupling, it is possible to avoid interference effects in the level conversion and thereby ensure stable output levels even when the supply voltage $V_{cc}$ varies.

Because current control works slightly slower than voltage control, however, it is advisable, for the purpose of accelerating the current control, to provide a dynamic coupling by means of a coupling capacity QC which is inserted between the inverting output of the current switch A and the control input A3 of the TTL-output stage C. This capacity may be realized as the barrier layer capacitance of a diode or as an oxide capacity. The coupling capacity C results in steep edges and small delay times through dynamic acceleration, i.e. due to voltge coupling at the instant of switching.

Figure 3:
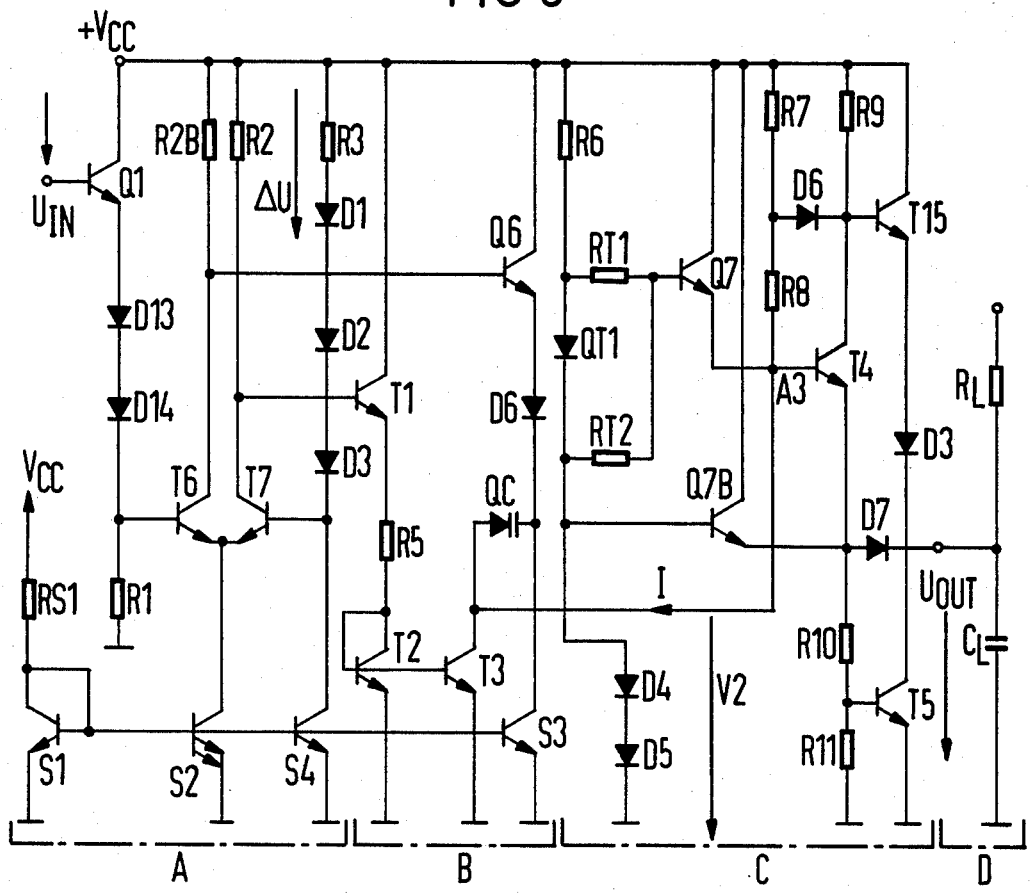
FIG. 3 is a circuit diagram of another embodiment of the circuit arrangement according to the invention.

Further measures for increasing the speed are apparent from the circuit diagram of FIG. 3 which shows an improved embodiment of a level converter according to the invention which is based on the circuit of FIG. 2. The circuit diagram according to FIG. 3 has, according to FIG. 1, the blocks A, B, C and D. Block A is realized, according to FIG. 2, by the transistors T6 and T7 as the current switch; block B by the transistors T1, T2 and T3, wherein T1 is the driving transistor, T3 is the output transistor and T2 is the diode coupled transistor, together forming a voltage-controlled current-source, and block C by the transistors T4, T15 and T5 as push-pull TTL-output stage.

In comparison with the embodiment of FIG. 2, the switching behavior of the converter of FIG. 3 is improved by the prevention of saturation effects in the transistors T3, T4 and T5. For this purpose, the transistors T3, T4 and T5 can be realized as Schottky-transistors or externally connected to clamping diodes in accordance with FIG. 3. The transistor T4 is clamped by a series of circuit formed of the diode D6, which is connected between the collector and the base of the transistor T4, and a resistor R8, in such a manner that its residual collector-emitter voltage cannot drop so far that the transistor T4 operates in the saturated range. The residual voltage at the transistor T4 is determined by the transistor R8. The residual collector-emitter voltage of the transistor T5 is clamped in a similar manner by means of the diode D7 and the resistor R10.

The residual collector-emitter voltage of the transistor T3 is clamped by the transistor Q7 which is arranged in the collector circuit of the transistor T3, and the base potential of the transistor T3 is maintained by the clamping network formed of the diodes QT1, D4, D5, the transistors Q7, Q7B and the resistors R6, RT1, RT2 at a voltage of $(k+2) \cdot U_{be}$, wherein k is the voltage-divider ratio of RT1 and RT2 with $$\left( k = \frac{RT2}{RT1 + RT2} \right).$$

The clamping network is constructed so that a series circuit formed of the resistor R6 and the diodes QT1, D4 and D5 is provided which is connected between the supply voltage (resistor R6) and ground (diode D5). From a junction point between the resistor R6 and the diode QT1, the resistor RT1 leads to the base of the transistor Q7, while the resistor RT2 leads to a junction point between the diode QT1 and the diode D4 to the base of the transistor Q7. The collector of the transistor Q7 is connected to the supply voltage $V_{cc}$, while the emitter of the transistor Q7 drives the base of the transistor T4 and the point A3. The transistor Q7B is arranged so that its collector is connected to the supply voltage $V_{cc}$, its emitter to the emitter of the transistor T4, and its base to the junction point between the diode QT1 and the diode D4. A result thereof is that the collector potential of T3 cannot drop below the value $(k+1) U_{be}$.

The base-emitter paths of the transistors T4 and T5 are clamped by means of this network in the blocked state to $k \cdot U_{be}$. The division ratios of the two voltage dividers formed by the resistors R10/R11 and RT1/RT2, respectively, must be selected as approximately the same and, advantageously, between 0.5 and 0.8. The following relationship applies:

$$k \approx \frac{R11}{R10 + R11} \approx \frac{RT2}{RT1 + RT2}$$

wherein R11 is the base resistance between the base of the transistor T5 and ground. The base potentials in the conducting state ($U_{Out}=$"low") are $(1/k+1) \cdot U_{be}$ for the transistor T4, and $U_{be}$ for the transistor T5.

In the blocked state, the clamping network limits the drop of the base potentials to $(k+1) \cdot U_{be}$ for the transistor T4 and to $1/k \cdot U_{be}$ for the transistor T5.

In order to achieve a reliable clamping effect, assurance must be provided, through suitable selection of the sizes of the transistors and diodes, that the base-emitter threshold voltages of the diodes D5, D4, QT1 and those of the transistors T4, T5, Q7 and Q7B are equal. The reference voltage $U_{ref}$ for the current switch formed of the transistors T6 and T7 is obtained in a manner that a voltage drop is produced at the resistor R3 which corresponds to one- half the excursion of the input signal $U_{IN}$ and, furthermore, both voltages (the input voltage $U_{IN}$ and the reference voltage $U_{ref}$) are shifted downwardly in the same manner via three diodes and transistor thresholds, respectively.

The current source $I_n$ is realized in a manner that, due to the resistor RS1 between the supply current $V_{cc}$, on the one hand, and the base and the collector respectively of the transistor S1, on the other hand, a reference current is defined which is mirrored in a conventional manner into the transistor S2. By equipping the transistor S2 with two emitter regions (area factor=2), $I_n$ will assume twice the value of the reference current $I_R=(V_{cc}-U_{be})/RS1$.

Of particular importance is the ECL excursion $\Delta U$ of the output current switch A, which is required in order to ensure the proper operation of the entire voltage under "worst-case" conditions, such as particularly, fluctuations of the supply voltage $V_{cc}$. The required switching potential at the input A3 of the TTL stage C is $$V_{2,erf} = \left( \frac{1}{k} + 1 \right) \cdot U_{be}, \text{ wherein} \tag{1}$$

$$k = \frac{R11}{R10 + R11} = \text{voltage divider ratio.}$$

The potential offered by the current source B, neglecting the loading by the diode D6 and the transistors T4 and Q7 (justified at the switching instant of the TTL stage C) is, for a "high" level at the input $U_{IN}$:

$$V_{2,H} = V_{cc} \left( 1 - \frac{R7 + R8}{R5} \right) + U_{be} \cdot \frac{R7 + R8}{R5} \tag{2}$$

and for "low" level at the input $U_{IN}$:

$$V_{2,L} = V_{cc} \, 1 - \frac{R7 + R8}{R5} \left( 1 - n \frac{R2}{RS1} \right) + \tag{3}$$

$$U_{be} \left( 2 - n \frac{R2}{RS1} \right) \cdot \frac{R7 + R8}{R5}$$

wherein n=2 . . . =area factor of the transistor S2.

The required minimum excursion $\Delta U_{min, erf}$ is calculated as follows:

$$\Delta U_{min,erf} = \frac{R5}{R7 + R8} \left\{ \left[ \left| \frac{\partial V_{2,L}}{\partial V_{cc}} \right|_{U_{be}=const} \right| + \right. \tag{4}$$

-continued $$\left|\frac{\partial V_{2,H}}{\partial V_{cc}}\right|_{U_{be}=const}\right] \cdot \Delta V_{cc} + \left[\left|\frac{\partial V_{2,L}}{\partial U_{be}}\right|_{V_{cc}=const}\right| +$$

$$\left|\frac{\partial V_{2,H}}{\partial U_{be}}\right|_{V_{cc}=const} - \left|\frac{dV_{2,erf}}{dU_{be}}\right|\right] \cdot \Delta U_{be}\right\}$$

By substituting equations (2) and (3) in equation (4) one obtains:

$$\Delta U_{min,erf} = \frac{R5}{R7+R8}\left\{\left|\left(1-\frac{R7+R8}{R5}\right)\left(2-n\frac{R2}{RS1}\right)\cdot\right.\right.$$

$$\left.\Delta V_{cc}\right| + \left[\left|\frac{R7+R8}{R5}\left(2-n\frac{R2}{RS1}\right)\right|-\right.$$

$$\left.\left(1+\frac{1}{k}\right)\right]\cdot\Delta U_{be}\right\} \quad (5)$$

The circuit according to FIG. 3 may, for example, by using conventional pn-diodes and conventional npn-transistors, be designed with respect to the resistances thereof as follows:

| | | |
|---|---|---|
| R2B = R2 = | 1 | kOhm |
| R3 = | 250 | Ohm |
| RS1 = | 4.2 | kOhm |
| R1 = | 6 | kOhm |
| R5 = | 2.7 | kOhm |
| R6 = | 5 | kOhm |
| RT1 = | 1.6 | kOhm |
| RT2 = | 4 | kOhm |
| R7 = | 3.2 | kOhm |
| R8 = | 800 | Ohm |
| R9 = | 1.5 | kOhm |
| R10 = | 250 | Ohm |
| R11 = | 800 | Ohm. |

Then the current of the current source $I_n=2mA$, the ECL excursion $\Delta U=2$ volts, and the current of the current source B is 1 mA for "high" and 0.4 mA for "low" level. The coupling capacity is 2 pF and the supply voltage $V_{cc}=+5$ volts.

If one assumes in equation (5) maximum fluctuations of the supply voltage $V_{cc}$ of conventionally $\Delta V_{cc}=1$ volt and temperature related variations $\Delta U_{be}$ of the base-emitter threshold voltage $U_{be}$ of $\Delta U_{be}=0.25$ volts, there is obtained for the given design:

$\Delta U_{min, erf}=0.45$ volts.

The excursion $\Delta U$ of 2 volts used in the circuit therefore ensures the maintenance of a sufficient interference margin under "worstcase" conditions. In order to obtain the same interference margin in both directions, the switching point of the TTL stage C must be reached at $\Delta U/2$. The following condition applies:

$$\frac{R7+R8}{R5} = \frac{V_{cc}-\left(\frac{1}{k}+1\right)\cdot U_{be}}{V_{cc}\left(1-\frac{n}{2}\frac{R2}{RS1}\right)-U_{be}\left(2-\frac{n}{2}\frac{R2}{RS1}\right)}$$

The switching behavior of a converter according to FIG. 3, which is designed as described hereinabove, is illustrated in FIG. 5, wherein all transistors are operated at the $f_T$- optimum i.e. the size of the BE-diodes thereof was matched to the collector currents to be switched so that the transistor switching times are minimized. As is apparent from the waveform of the ECL-input pulse E present at the input $U_{IN}$ and of the TTL output pulse AS present at the output $U_{Out}$, the switching times are less than 6 ns for rising and falling edges.

As may be seen hereinafter following Table 1, this circuit has a very constant "low" output level in all "worst-case" situations ($V_{OL}$ (V)=output low level, as a function of the supply voltage and the temperature).

TABLE 1

| | $V_{OL}(v)$ | 0° C. | 27° C. | 70° C. |
|---|---|---|---|---|
| | 4,5 V | 0,373 | 0,367 | 0,358 |
| $V_{cc}$ | 5 V | 0,369 | 0,363 | 0,356 |
| | 5,5 V | 0,367 | 0,361 | 0,357 |

The static transfer characteristics of the circuit according to FIG. 3 may be derived from FIG. 4 which shows the control current I and the TTL-output voltage present at the output $U_{Out}$ as a function of the input voltage $U_{IN}$.

The foregoing is a description corresponding in substance to German Application No. P 32 17 512.4, filed May 10, 1982, the International priority of which is being claimed for the instant application, and which is hereby made part of this application. Any material discrepancies between the foregoing specification and the aforementioned corresponding German applications are to be resolved in favor of the latter.

I claim:

1. Circuit arrangement for level conversion of ECL-logic levels having an emitter-coupled current switch having an input addressable by ECL-logic levels and having an inverting and a non-inverting output, and a TTL-logic output stage, comprising a voltage-controlled current source formed as a current mirror with transistor diode and having an input addressable by the non-inverting output of the current switch, and the curent switch having the inverting output connected via a capacitor to the input of the TTL-logic stage.

2. Circuit arrangement according to claim 1 wherein said current source comprises a current mirror including a driving transistor, an output transistor and a transistor diode.

3. Circuit arrangement according to claim 1 wherein said TTL-logic output stage is a push-pull stage.

4. Circuit arrangement according to claim 1 wherein said TTL-logic output stage has at least one transistor, and including means for clamping the residual collector-emitter voltage of said transistor.

5. Circuit arrangement according to claim 1 wherein sid TTL-logic ouput stage has at least one transistor, and including means for clamping base potentials of said transistor.

6. Circuit arrangement according to claim 2 wherein said current mirror has an output transistor and includes means for clamping the residual collector-emitter voltage of said output transistor.

7. Circuit arrangement for level conversion of ECL-logic levels to TTL-logic levels having an emitter-coupled current switch having an input addressable by ECL-logic levels and having an inverting transistor with an inverting output and an non-inverting transistor with an non-inverting output, and a TTL-logic output stage, comprising a voltage-controlled current source formed as a current mirror having a transistor diode and an input addressable by an output from the non-inverting output of the current switch; the current switch having an output connected via a capacitor to the input of the TTL-logic output stage; and wherein said capacitor is connected between said inverting output of said current switch and an input of said TTL-logic output stage.

8. Circuit arrangement for level conversion of ECL-logic levels to TTL-logic levels having an emitter-coupled current switch having an input addressable by ECL-logic levels and having inverting and non-inverting transistors; and a TTL-logic stage, comprising a voltge-controlled current source formed as a current mirror with a transistor diode and having an input addressable by an output from the non-inverting side of the current switch; the current switch having an output connected via a capacitor to the input of the TTL-logic output stage; and output transistor included in the current mirror; and wherein said capacitor is formed by the capacitance of a barrier layer diode connected between the collector of the output transistor of the current mirror and the collector of the inverting transistor of the current switch.

9. Circuit arrangement for level conversion of ECL-logic levels to TTL-logic levels having an emitter-coupled current switch having an input addressable by ECL-logic levels and having inverting and non-inverting transistors, and a TTL-logic output stage, comprising a voltage-controlled current source formed as a current mirror with a transistor diode and having an input addressable by an output from the non-inverting side of the current switch, and the current switch having an output connected via a capcacitor to the input of the TTL-logic output stage; an output transistor included in the current mirror; and wherein said capacitor is an oxide layer capacitor connected between the collector of the output transistor of the current mirror and the collector of the inverting transistor of the current switch.

* * * * *